United States Patent
Huang

(10) Patent No.: US 7,446,684 B2
(45) Date of Patent: Nov. 4, 2008

(54) READOUT CIRCUIT FOR AN IMAGE SENSOR AND ANALOG-TO-DIGITAL CONVERTING METHOD THEREOF

(75) Inventor: Yu-Chun Huang, Hsinchu Hsien (TW)

(73) Assignee: Pixart Imaging, Inc., Hsien (TW)

( * ) Notice: Subject to any disclaimer, the term of this patent is extended or adjusted under 35 U.S.C. 154(b) by 0 days.

(21) Appl. No.: 11/481,307

(22) Filed: Jul. 5, 2006

(65) Prior Publication Data

US 2007/0013565 A1   Jan. 18, 2007

(30) Foreign Application Priority Data

Jul. 12, 2005   (TW) ............................... 94123559 A

(51) Int. Cl.
*H03M 1/00*   (2006.01)

(52) U.S. Cl. ..................... 341/139; 341/155; 341/122; 341/169; 348/241; 348/217.1; 348/229.1

(58) Field of Classification Search ................ 341/139, 341/122, 118, 169, 155; 348/241, 217.1, 348/229.1
See application file for complete search history.

(56) References Cited

U.S. PATENT DOCUMENTS

| | | | |
|---|---|---|---|
| 5,691,821 A * | 11/1997 | Hieda et al. ............... | 348/217.1 |
| 5,726,654 A * | 3/1998 | Hatae et al. ................ | 341/161 |
| 5,920,274 A * | 7/1999 | Gowda et al. .............. | 341/155 |
| 6,124,819 A * | 9/2000 | Zhou et al. ................. | 341/155 |
| 6,275,259 B1 * | 8/2001 | Gowda et al. ............. | 348/229.1 |
| 6,567,028 B2 * | 5/2003 | Huang et al. .............. | 341/155 |
| 6,867,717 B1 * | 3/2005 | Ion et al. ................... | 341/118 |
| 6,885,331 B2 * | 4/2005 | Krymski .................... | 341/169 |
| 6,885,396 B1 * | 4/2005 | Panicacci et al. .......... | 348/241 |
| 7,236,117 B1 * | 6/2007 | Varma et al. ............... | 341/155 |
| 2005/0151677 A1 * | 7/2005 | Chou ......................... | 341/122 |

* cited by examiner

*Primary Examiner*—Jean B Jeanglaude
(74) *Attorney, Agent, or Firm*—Brinks Hofer Gilson & Lione

(57) ABSTRACT

A readout circuit is adapted for receiving a line analog image signal from an image sensor array of an image sensor. The readout circuit includes an amplifying unit, an m-bit analog-to-digital converter, and an m-to-n bit digital converting unit. The amplifying unit is adapted for amplifying and correcting amplitude of the line analog image signal, and outputs an amplified and corrected analog signal. The m-bit analog-to-digital converter is coupled to the amplifying unit, and is operable to convert the amplified and corrected analog signal into a corresponding m-bit digital signal. The m-to-n bit digital converting unit is coupled to the m-bit analog-to-digital converter, receives the m-bit digital signal from the m-bit analog-to-digital converter, and is responsive to a k-bit control signal for converting the m-bit digital signal into an n-bit digital signal, wherein m is greater than or equal to n.

13 Claims, 5 Drawing Sheets

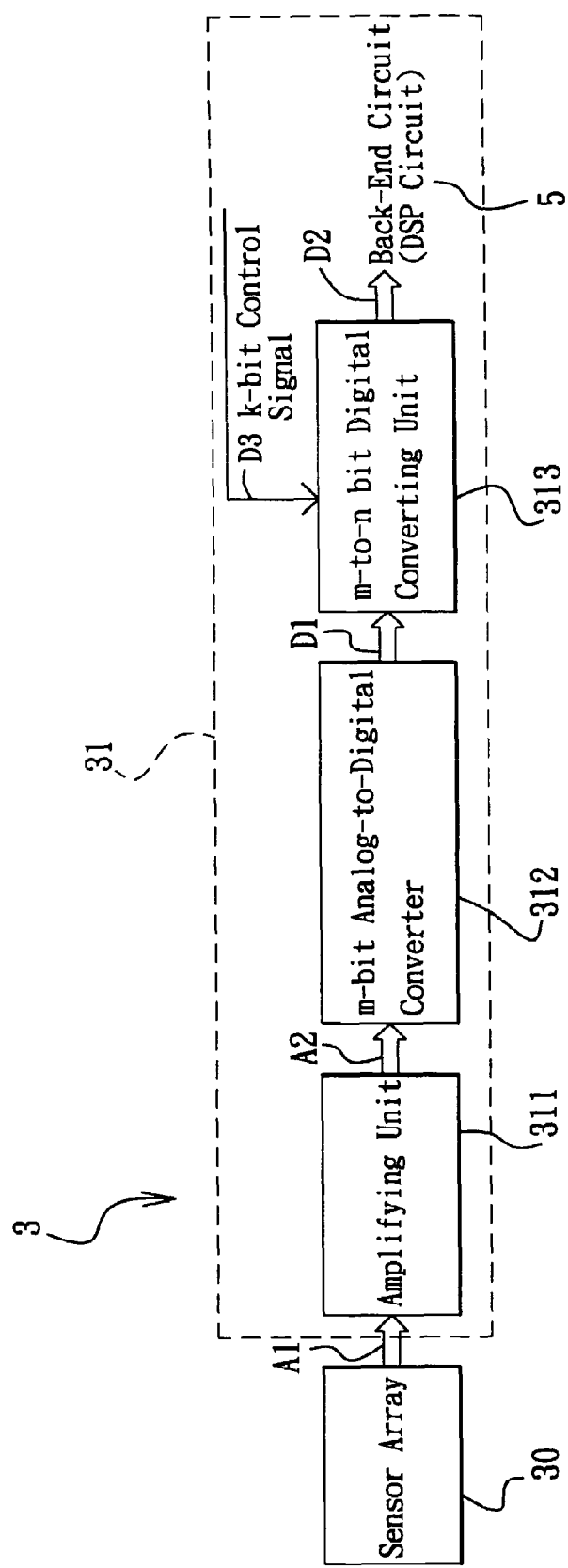
F I G. 3

_US 7,446,684 B2_

READOUT CIRCUIT FOR AN IMAGE SENSOR AND ANALOG-TO-DIGITAL CONVERTING METHOD THEREOF

CROSS-REFERENCE TO RELATED APPLICATION

This application claims priority of Taiwanese Application No. 094123559, filed on Jul. 12, 2005.

BACKGROUND OF THE INVENTION

1. Field of the Invention

The invention relates to a readout circuit, more particularly to a readout circuit adapted for receiving a line analog image signal from a sensor array of an image sensor.

2. Description of the Related Art

Complementary Metal Oxide Semiconductor (CMOS) image sensors are widely used in digital image capturing devices, such as video camcorders, digital cameras, camera cell phones, web cameras, etc. As shown in FIG. 1, a conventional image sensor 1 generally includes a sensor array 10 including a matrix of sensor units (not shown). Each of the sensor units is capable of sensing light, and is operable to output a sequence of line analog image signals (a1) that correspond to the light sensed thereby. The line analog image signals (a1) are outputted to an amplifying unit 111 of a readout circuit 11 for amplifying and correcting amplitude of the line analog image signals (a1). An n-bit analog-to-digital converter 112 of the readout circuit 11 is coupled to the amplifying unit 111, and converts the amplified and corrected analog image signal (a2) from the amplifying unit 111 into a corresponding n-bit digital image signal (d1), which is subsequently outputted to a back-end circuit (e.g., a digital signal processing (DSP) unit) for signal processing.

During analog-to-digital conversion in the readout circuit 11 of the prior art, signal distortion is likely to occur. As shown in FIG. 2, ideal image signal voltage distribution (E1) ranges from 0 to $V_1$. However, actual image signal voltage distribution (E2) differs from the ideal image signal distribution (E1) by an offset value, $V_{offset}$. In other words, the actual image signal voltage distribution (E2) ranges from $V_{offset}$ to $V_2$, where $V_2 = V_1 + V_{offset}$. It has been proposed heretofore to use an analog adder-subtracter (not shown) to subtract a modifying signal $V_p$ from the actual image signal in an attempt to reduce image distortion. However, since the adder-subtracter has a higher resolution than that of the analog-to-digital converter, the modifying signal $V_p$ differs from the offset value $V_{offset}$, i.e., $V_p \neq V_{offset}$. Therefore, although image distortion is reduced in the distribution (E3) of the modified image signal, it is not completely eliminated, resulting in a relatively low capturing resolution of the image.

SUMMARY OF THE INVENTION

Therefore, the object of the present invention is to provide a readout circuit for an image sensor, and capable of reducing image signal distortion so as to increase capturing resolution of images.

According to one aspect of the present invention, there is provided a readout circuit adapted for receiving a line analog image signal from an image sensor array of an image sensor. The readout circuit includes an amplifying unit, an m-bit analog-to-digital converter, and an m-to-n bit digital converting unit. The amplifying unit is adapted for amplifying and correcting amplitude of the line analog image signal, and outputs an amplified and corrected analog signal. The m-bit analog-to-digital converter is coupled to the amplifying unit, and is operable to convert the amplified and corrected analog signal into a corresponding m-bit digital signal. The m-to-n bit digital converting unit is coupled to the m-bit analog-to-digital converter, receives the m-bit digital signal from the m-bit analog-to-digital converter, and is responsive to a k-bit control signal for converting the m-bit digital signal into an n-bit digital signal, wherein m is greater than or equal to n.

According to another aspect of the present invention, there is provided an analog-to-digital converting method for an image sensor that is capable of sensing an image and outputting a line analog image signal for the image sensed thereby. The analog-to-digital converting method includes the steps of: converting the line analog image signal into a corresponding m-bit digital signal; and converting the m-bit digital signal into an n-bit digital signal based on a k-bit control signal, wherein m is greater than or equal to n.

According to yet another aspect of the present invention, there is provided an image sensor that includes a sensor array and a readout circuit. The sensor array is capable of sensing an image, and is operable to output a sequence of line analog image signals. The readout circuit is coupled to the sensor array, and includes an amplifying unit, an m-bit analog-to-digital converter, and an m-to-n bit digital converting unit. The amplifying unit amplifies and corrects amplitudes of the line analog image signals, and outputs amplified and corrected analog signals. The m-bit analog-to-digital converter is coupled to the amplifying unit, and is operable to convert the amplified and corrected analog signals into corresponding m-bit digital signals. The m-to-n bit digital converting unit is coupled to the m-bit analog-to-digital converter, receives the m-bit digital signals from the m-bit analog-to-digital converter, and is responsive to a k-bit control signal for converting the m-bit digital signals into n-bit digital signals, wherein m is greater than or equal to n.

BRIEF DESCRIPTION OF THE DRAWINGS

Other features and advantages of the present invention will become apparent in the following detailed description of the preferred embodiment with reference to the accompanying drawings, of which:

FIG. 3 is a schematic circuit block diagram of the preferred embodiment of an image sensor according to the present invention;

DETAILED DESCRIPTION OF THE PREFERRED EMBODIMENT

Figure 1:
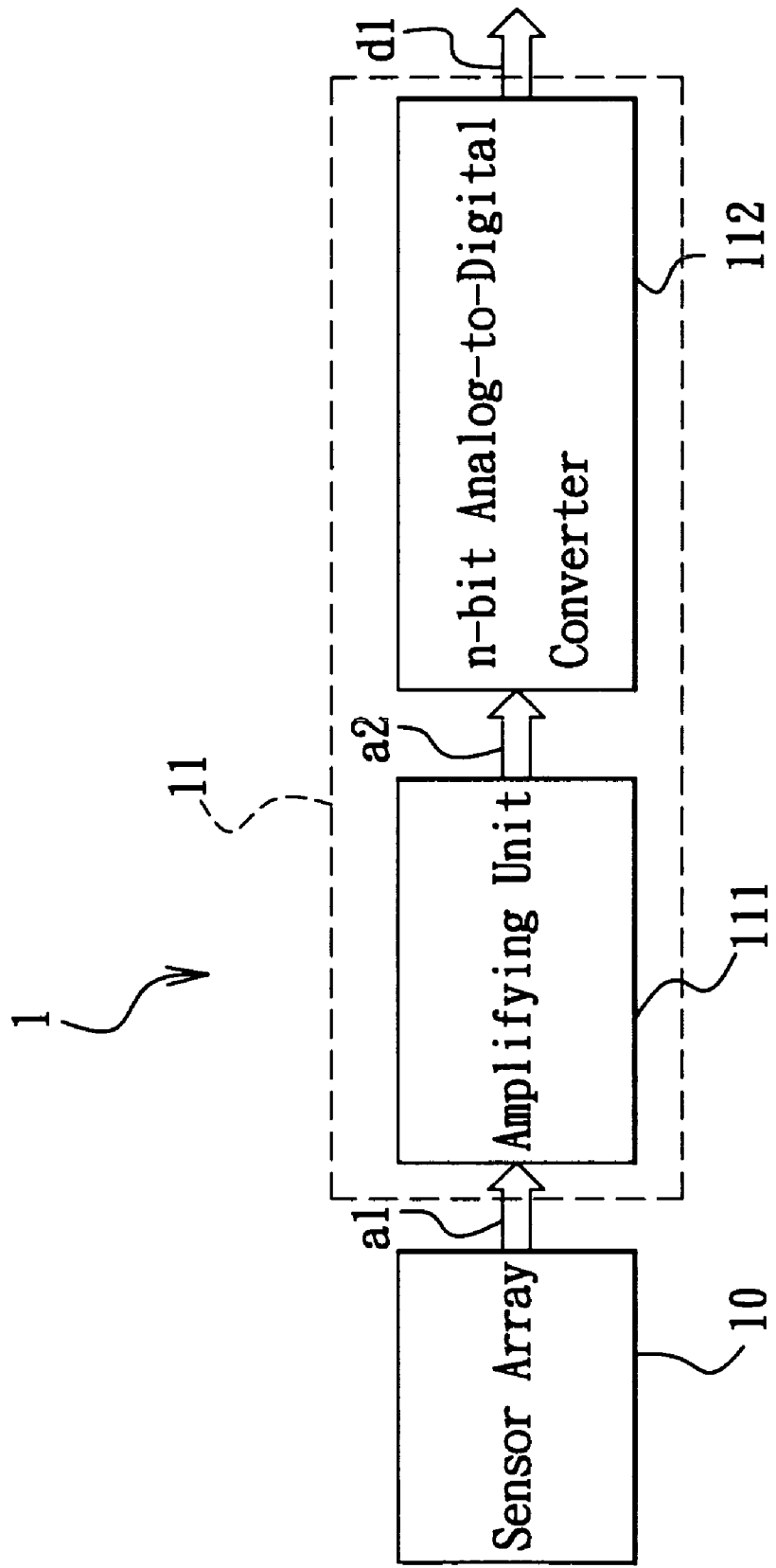
FIG. 1 is a schematic circuit block diagram of a conventional image sensor.
Figure 2:
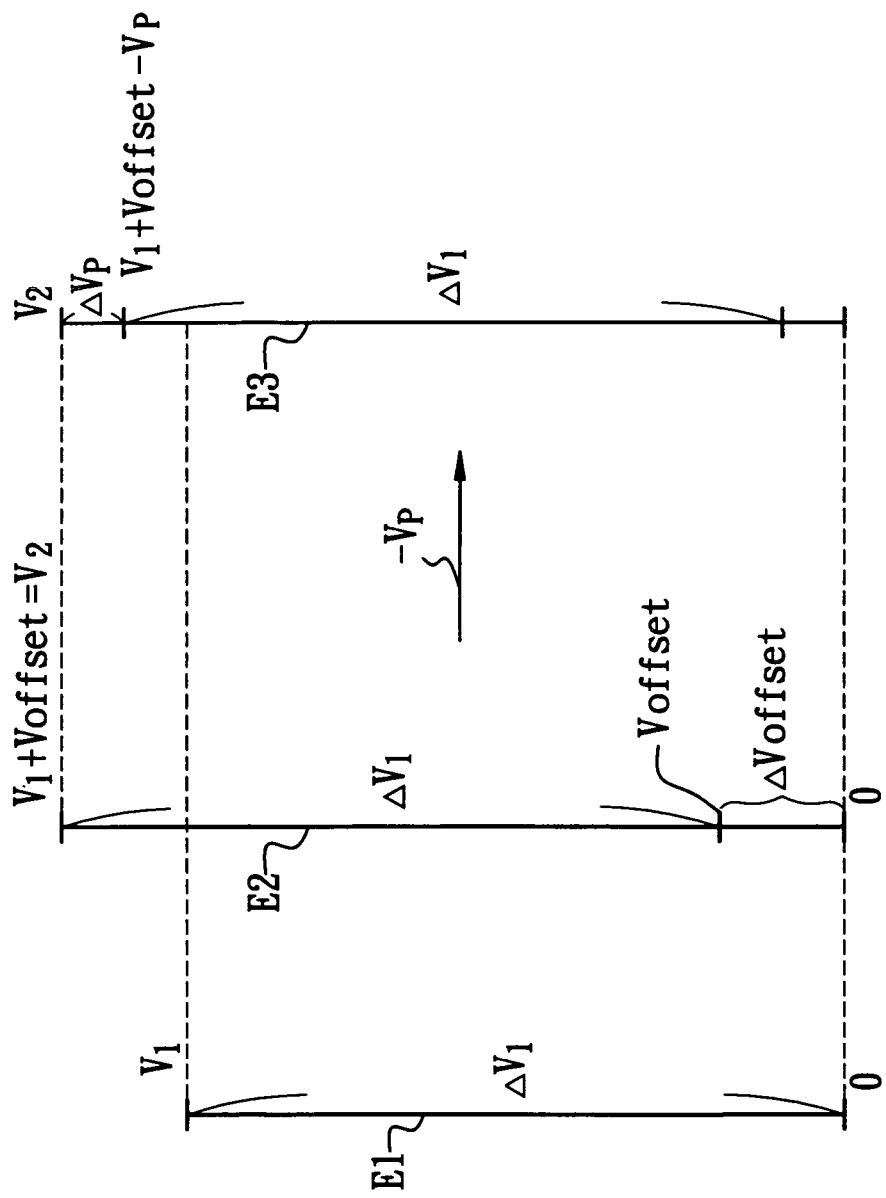
FIG. 2 is a schematic diagram of the prior art, illustrating differences between ideal, actual and modified image signal voltage distributions.
Figure 4:
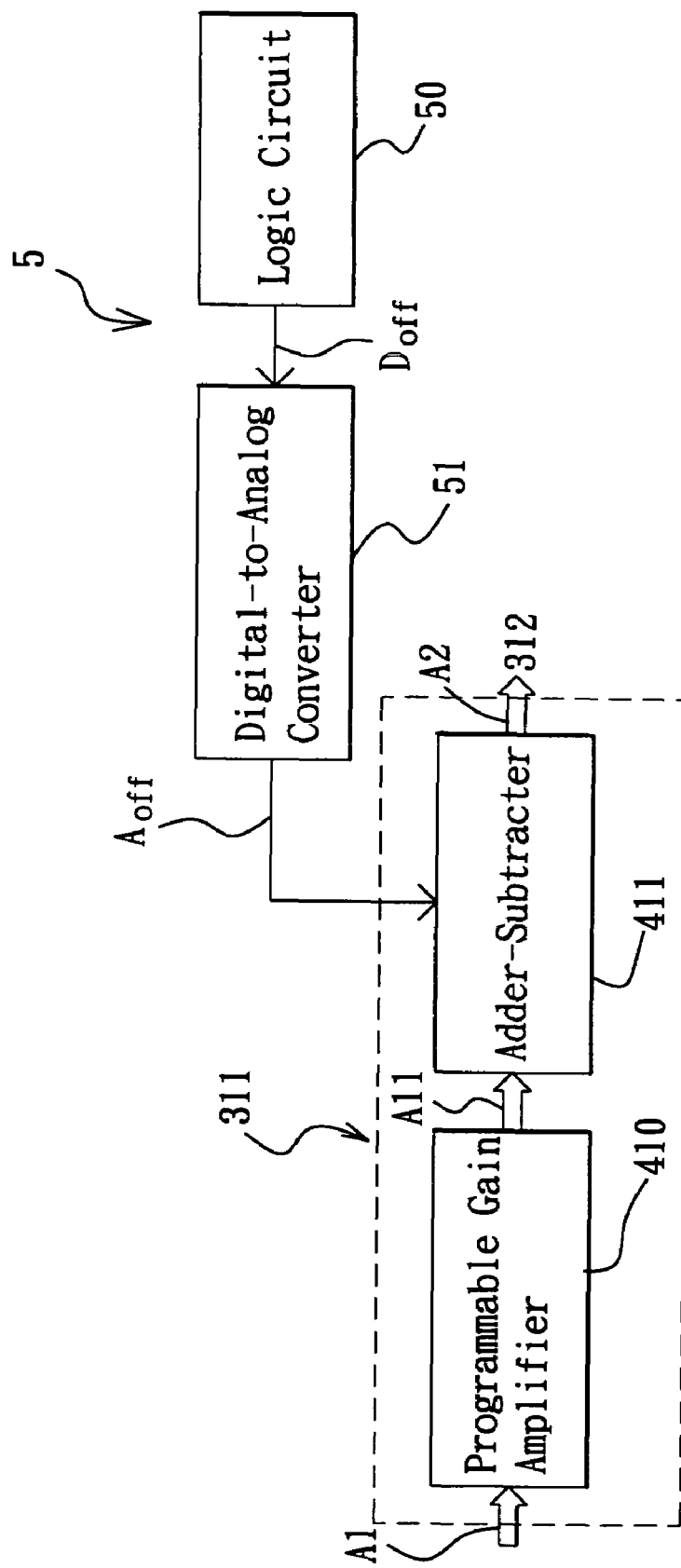
FIG. 4 is a schematic circuit block diagram of the preferred embodiment, illustrating in detail an amplifying unit of the image sensor.

As shown in FIG. 3 and FIG. 4, the preferred embodiment of an image sensor 3 according to the present invention includes a sensor array 30 and a readout circuit 31. The sensor array 30 includes a matrix of sensor units (not shown), each of which is capable of sensing light and is operable to output a sequence of line analog image signals (A1) that corresponds to the light sensed thereby. The readout circuit 31 is coupled to the sensor array 30, and includes an amplifying unit 311, an m-bit analog-to-digital converter 312, and an m-to-n bit digital converting unit 313, wherein m≧n.

The amplifying unit 311 receives the line analog image signals (A1) outputted by the sensor array 30, amplifies and corrects amplitudes of the line analog image signals (A1), and outputs amplified and corrected analog signals (A2).

As shown in FIG. 4, the amplifying unit 311 includes a programmable gain amplifier 410, and an adder-subtracter 411 in this embodiment. The programmable gain amplifier 410 is operable to amplify the line analog image signals (A1) into amplified analog signals (A11), each of which has a predefined gain. The adder-subtracter 411 is coupled to the programmable gain amplifier 410, and is responsive to an analog offset signal ($A_{off}$) for performing addition or subtraction on the amplified analog signals (A11) to result in the amplified and corrected analog signals (A2). In particular, a logic unit 50 of a back-end circuit 5 (e.g., a digital signal processing (DSP) circuit 5 as shown in FIG. 3) computes a digital offset signal ($D_{off}$). A digital-to-analog converter 51 of the DSP circuit 5 subsequently converts the digital offset signal ($D_{off}$) into the analog offset signal ($A_{off}$), which is then fed into the adder-subtracter 411 in order to perform the addition or subtraction on the amplified analog signals (A11) to result in the amplified and corrected analog signals (A2).

The m-bit analog-to-digital converter 312 is coupled to the amplifying unit 311, and is operable to convert the amplified and corrected analog signals (A2) into corresponding m-bit digital signals (D1).

The m-to-n bit digital converting unit 313 is coupled to the m-bit analog-to-digital converter 312, receives the m-bit digital signals (D1) from the m-bit analog-to-digital converter 312, and is responsive to a k-bit control signal (D3) for converting the m-bit digital signals (D2) into n-bit digital signals (D2), wherein m is greater than or equal to n, i.e., m≧n, and k can be any non-negative integer.

In particular, each of the m-bit digital signals (D1) is associated with a corresponding first hexadecimal value that falls within a first range. Each of the n-bit digital signals (D2) is associated with a corresponding second hexadecimal value that falls within a second range. The second range is one of a plurality of sub-ranges falling within the first range, and is selected according to the k-bit control signal (D3). In this embodiment, the sub-ranges are equal in size. In addition, each of the sub-ranges has a minimum value that differs from those of the other sub-ranges, and a maximum value that differs from those of the other sub-ranges.

In this embodiment, the size of each of the sub-ranges is $2^n$. The minimum value of the second range is the hexadecimal value of the k-bit control signal (D3), and the maximum value of the second range is the hexadecimal value of the k-bit control signal (D3) plus ($2^n-1$).

Figure 5:
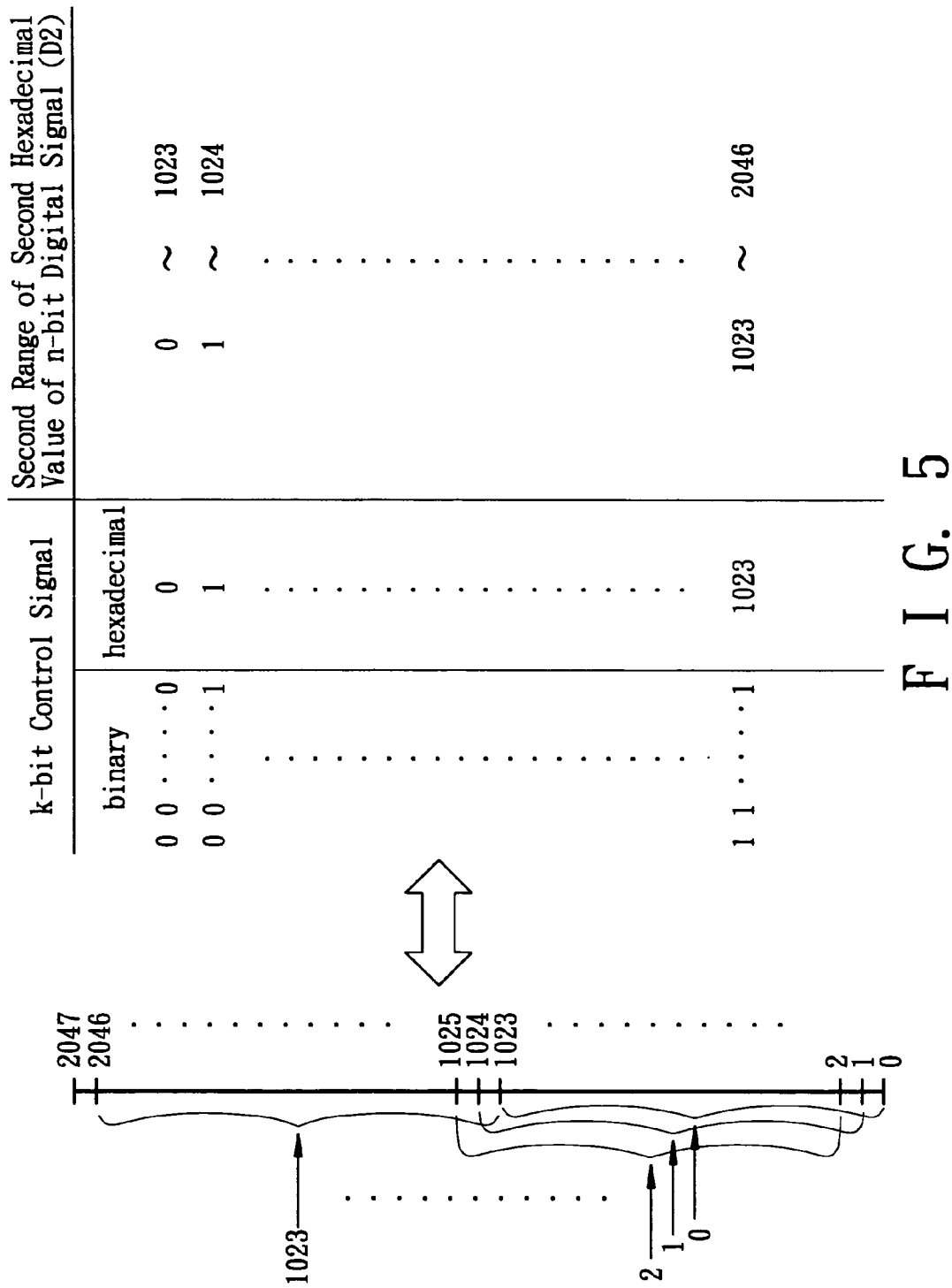
FIG. 5 is a schematic diagram illustrating operation of an m-to-n bit digital converting unit of the preferred embodiment by way of an example.

To illustrate the operation of the m-to-n bit digital converting unit 313 according to this embodiment, an example is illustrated in FIG. 5, where n=10, m=n+1=11, and k=m−1=10. Therefore, the m-to-n bit digital converting unit 313 is an 11-to-10 bit digital converting unit. Each of the m-bit digital signals (D1) is an 11-bit digital signal. Since $2^{11}$=2048, the first range of the first hexadecimal value of the m-bit digital signal (D1) distributes is 0 to 2047. Each of the n-bit digital signals (D2), as well as the k-bit control signal (D3), is a 10-bit digital signal. Note that $2^{10}$=1024.

If the k-bit control signal (D3) received by the m-to-n bit digital converting unit 313 is 0 . . . 00 (binary)=0 (hexadecimal), the second range of the second hexadecimal value of the n-bit digital signal (D2) selected by the m-to-n bit digital converting unit 313 is from 0 to 1023. If the k-bit control signal (D3) is 0 . . . 01 (binary)=1 (hexadecimal), the second range of the second hexadecimal value of the n-bit digital signal (D2) selected by the m-to-n bit digital converting unit 313 ranges from 1 to 1024. Accordingly, when the k-bit control signal (D3) is 1 . . . 11 (binary)=1023 (hexadecimal), the second range of the second hexadecimal value of the n-bit digital signal (D2) selected by the m-to-n bit digital converting unit 313 is from 1023 to 2046.

Therefore, by utilizing the m-to-n bit digital converting unit 313, the minimum and maximum values of the second range of the second hexadecimal value of the n-bit digital signal (D2) can be selected to reduce image distortion, and provide a better dynamic capturing range for resultant images.

While the present invention has been described in connection with what is considered the most practical and preferred embodiment, it is understood that this invention is not limited to the disclosed embodiment but is intended to cover various arrangements included within the spirit and scope of the broadest interpretation and equivalent arrangements.

What is claimed is:

1. A readout circuit adapted for receiving a line analog image signal from an image sensor array of an image sensor, said readout circuit comprising:
   an amplifying unit adapted for amplifying and correcting amplitude of the line analog image signal, and for outputting an amplified and corrected analog signal;
   an m-bit analog-to-digital converter coupled to said amplifying unit, and operable to convert the amplified and corrected analog signal into a corresponding m-bit digital signal; and
   an m-to-n bit digital converting unit coupled to said m-bit analog-to-digital converter, receiving the m-bit digital signal from said m-bit analog-to-digital converter, and responsive to a k-bit control signal for converting the m-bit digital signal into an n-bit digital signal, wherein m is greater than or equal to n,
   wherein the m-bit digital signal falls within a first range, the n-bit digital signal falls within a second range, and the second range is one of a plurality of sub-ranges falling within the first range and selected according to the k-bit control signal.

2. The readout circuit as claimed in claim 1, wherein said amplifying unit includes:
   a programmable gain amplifier operable to amplify the line analog image signal into an amplified analog signal having a predefined gain; and
   an adder-subtracter coupled to said programmable gain amplifier, and responsive to an offset signal for performing addition or subtraction on the amplified analog signal to result in the amplified and corrected analog signal.

3. The readout circuit as claimed in claim 1, wherein the m-bit digital signal is associated with a first hexadecimal value that falls within the first range, the n-bit digital signal being associated with a second hexadecimal value that falls within the second range, the second range being one of a plurality of sub-ranges falling within the first range and selected according to the k-bit control signal.

4. The readout circuit as claimed in claim 3, wherein the sub-ranges are equal in size.

5. The readout circuit as claimed in claim 4, wherein each of the sub-ranges has a minimum value that differs from those of the other sub-ranges, and a maximum value that differs from those of the other sub-ranges.

6. An analog-to-digital converting method for an image sensor that is capable of sensing an image and outputting a line analog image signal for the image sensed thereby, said analog-to-digital converting method comprising the steps of:
- converting the line analog image signal into a corresponding m-bit digital signal; and
- converting the m-bit digital signal into an n-bit digital signal based on a k-bit control signal, wherein m is greater than or equal to n;
- wherein the step of converting the line analog image signal into the corresponding m-bit digital signal includes:
- amplifying and correcting amplitude of the line analog image signal; and
- converting the amplified and corrected analog image signal into the m-bit digital signal; and
- wherein the m-bit digital signal is associated with a first hexadecimal value that falls within a first range, the n-bit digital signal being associated with a second hexadecimal value that falls within a second range, the second range being one of a plurality of sub-ranges falling within the first range and selected according to the k-bit control signal.

7. The analog-to-digital converting method as claimed in claim 6, wherein the sub-ranges are equal in size.

8. The analog-to-digital converting method as claimed in claim 7, wherein each of the sub-ranges has a minimum value that differs from those of the other sub-ranges, and a maximum value that differs from those of the other sub-ranges.

9. An image sensor comprising:
- a sensor array capable of sensing an image, and operable to output a sequence of line analog image signals; and
- a readout circuit coupled to said sensor array and including
- an amplifying unit for amplifying and correcting amplitudes of the line analog image signals, and for outputting amplified and corrected analog signals,
- an m-bit analog-to-digital converter coupled to said amplifying unit, and operable to convert the amplified and corrected analog signals into corresponding m-bit digital signals, and
- an m-to-n bit digital converting unit coupled to said m-bit analog-to-digital converter, receiving the m-bit digital signals from said m-bit analog-to-digital converter, and responsive to a k-bit control signal for converting the m-bit digital signals into n-bit digital signals, wherein m is greater than or equal to n,
- wherein the m-bit digital signal falls within a first range, the n-bit digital signal falls within a second range, and the second range is one of a plurality of sub-ranges falling within the first range and selected according to the k-bit control signal.

10. The image sensor as claimed in claim 9, wherein each of the m-bit digital signals is associated with a corresponding first hexadecimal value that falls within the first range, each of the n-bit digital signals being associated with a corresponding second hexadecimal value that falls within the second range, the second range being one of a plurality of sub-ranges falling within the first range and selected according to the k-bit control signal.

11. The image sensor as claimed in claim 10, wherein the sub-ranges are equal in size.

12. The image sensor as claimed in claim 11, wherein each of the sub-ranges has a minimum value that differs from those of the other sub-ranges, and a maximum value that differs from those of the other sub-ranges.

13. The image sensor as claimed in claim 9, wherein said amplifying unit of said readout circuit includes:
- a programmable gain amplifier operable to amplify the line analog image signals into amplified analog signals, each having a predefined gain; and
- an adder-subtracter coupled to said programmable gain amplifier, and responsive to an offset signal for performing addition or subtraction on the amplified analog signals to result in the amplified and corrected analog signals.

* * * * *